and Masanori Imai, both
United States Patent [19]

Kita et al.

[11] Patent Number: 4,845,009
[45] Date of Patent: Jul. 4, 1989

[54] PHOTOSENSITIVE COMPOSITION COMPRISING A POLYMER WITH MALEIMIDO GROUP IN SIDE CHAIN AND A DIAZO RESIN

[75] Inventors: Nobuyuki Kita; Masanori Imai, both of Shizuoka, Japan

[73] Assignee: Fuji Photo Film Co., Ltd., Minami-ashigara, Japan

[21] Appl. No.: 908,303

[22] Filed: Sep. 17, 1986

[30] Foreign Application Priority Data

Oct. 1, 1985 [JP] Japan .................................. 60-218561

[51] Int. Cl.[4] .......................... G03C 1/60; G03C 1/495
[52] U.S. Cl. .................................... 430/176; 430/192; 430/270; 430/320; 430/175
[58] Field of Search ............... 430/175, 270, 326, 330, 430/192, 176

[56] References Cited

U.S. PATENT DOCUMENTS

| 3,988,157 | 10/1976 | Van Paesschen et al. | 430/535 |
| 4,220,700 | 9/1980 | McGuckin et al. | 430/175 |
| 4,289,838 | 9/1981 | Rowe et al. | 430/175 |
| 4,416,975 | 11/1983 | Green et al. | 430/327 |
| 4,614,701 | 9/1986 | Mori et al. | 430/175 |
| 4,626,497 | 12/1986 | Roth et al. | 430/293 |
| 4,720,445 | 1/1988 | Brahim et al. | 430/330 |

FOREIGN PATENT DOCUMENTS

| 0974326 | 9/1982 | U.S.S.R. | 430/175 |
| 2044788 | 10/1980 | United Kingdom | 430/175 |

Primary Examiner—Paul R. Michl
Assistant Examiner—Patrick A. Doody
Attorney, Agent, or Firm—Burns, Doane, Swecker & Mathis

[57] ABSTRACT

The present invention relates to a photosensitive composition suitable for the use in the preparation of a photosensitive lithographic plate. The photosensitive composition comprises (1) a polymer having a maleimido group in its side chain and being capable of being photocrosslinked, such as a copolymer of methyl methacrylate/N-[2-(methacryloyloxy)-ethyl]-2,3-dimethylmaleimide/methacrylic acid=15/65/20 (weight ratio) and (2) a diazo resin such as dodecylbenzenesulfonate of condensate of p-diazodiphenylamine and formaldehyde.

17 Claims, No Drawings

PHOTOSENSITIVE COMPOSITION COMPRISING A POLYMER WITH MALEIMIDO GROUP IN SIDE CHAIN AND A DIAZO RESIN

BACKGROUND OF THE INVENTION (1) Field of the Invention

The present invention relates to a photosensitive composition suitable for the use in the preparation of a photosensitive lithographic plate. More particularly, the invention relates to a new photosensitive composition containing a photo-crosslinkable polymer and having an improved adhesion to the support.

(2) Prior Art

Photo-crosslinkable materials which are crosslinked by a ring-addition reaction are well known. They are used frequently as a principal component of photosensitive compositions used in the preparation of photosensitive lithographic plates, etc. Among these crosslinkable materials, photo-crosslinkable polymers having maleimido group(s) in a side chain thereof have not been used practically, even though they have high sensitivity and are useful as a photoresist, since the adhesion thereof to the support or to another layer is unsatisfactory. More particularly, when a photosensitive composition containing a photo-crosslinkable polymer having maleimido group(s) in a side chain thereof is prepared and used in the production of a lithographic plate, a peeling off of the image-areas occurs in the course of printing making the production of large numbers of prints impossible and the sensitivity thereof on the gray scale is low.

SUMMARY OF THE INVENTION

The present invention has been completed on the basis of finding that the above-mentioned problems can be solved effectively by using a photocrosslinkable polymer having a maleimido group in its side chain in combination with a negative working diazo resin.

It is, therefore, a primary object of the present invention to provide a photosensitive composition having improved adhesion to the support and another layer, while maintaining excellent sensitivity of a polymer having maleimido groups in its side chain and being capable of being photocrosslinked.

This and other objects of the present invention will be clear from the following description.

In accordance with the present invention, there is provided a photosensitive composition comprising (1) a polymer having a maleimido group in its side chain and being capable of being photocrosslinked and (2) a diazo resin.

Description of the Preferred Embodiments

Examples of the polymers having a maleimido group in their side chain and being capable of being photo-crosslinked include those having a maleimido group of the general formula (I) in a side chain thereof:

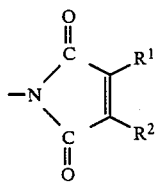

wherein $R^1$ and $R^2$ each represent a hydrogen atom, a halogen atom, preferably chlorine, bromine or iodine atom, or an alkyl group having preferably 1 to 4 carbon atoms, particularly a methyl group, or $R^1$ and $R^2$ may form together a five-membered or six-membered ring. These polymers are disclosed in, for example, the specifications of Japanese Patent Application (OPI) No. 988/1977 (corresponding to U.S. Pat. No. 4,079,041; the term "OPI" as used herein means an unexamined published patent application), West German Pat. No. 2,626,769 and European Pat. Nos. 21,019 and 3,552, pages 163 to 181 of Die Angewandte Mackromolekulare Chemi 115 (1983), Japanese Patent OPI Nos. 128991/1974 to 128993/1974, 5376/1975 to 5380/1975, 5298/1978 to 5300/1978, 50107/1975, 47940/1976, 13907/1977, 45076/1975, 121700/1977, 10884/1975, and 45087/1975 and West German Pat. Nos. 2,349,948 and 2,616,276. Among these polymers, those having two or more maleimido groups on average per molecule in their side chain and an average molecular weight of at least 1000 are used preferably as the polymer (1) according to the present invention. These polymers can be easily prepared by, for example, copolymerizing a monomer of any of the following formulas (II) to (IV):

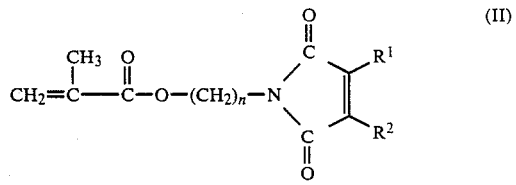

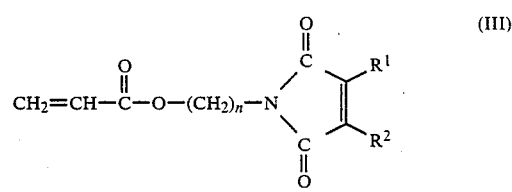

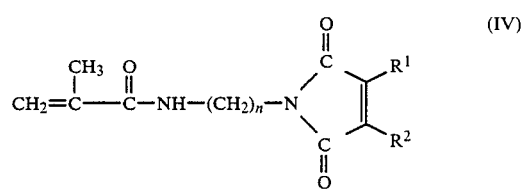

Wherein $R^1$ and $R^2$ are as defined above and n represents an integer, preferably 1 or 2 with a vinyl monomer having an alkali-soluble group and/or a group reactive with the photo-decomposition product of the diazo resin in its molecule in a molar ratio of, for example, 95/5 to 30/70, preferably 90/10 to 70/30. The acid group-having polymers are preferred, since an aqueous alkali solution can be used in the development step and they cause substantially no environmental pollution. The acid value of the acid group-having maleimide polymer is preferably in the range of 20 to 250, particularly 50 to 150. Examples of the copolymerizable vinyl monomers include carboxyl group-having monomers such as acrylic acid and methacrylic acid and those having a group reactive with the photo-decomposition product of the diazo resin such as 2-hydroxyethyl methacrylate, 2-hydroxyethyl acrylate, acrylonitrile, 2-cyanoethyl methacrylate, 2-cyanoethyl acrylate, acrylamide, N-phenylmethacrylamide, N-phenylacrylamide, N-(hydroxyphenyl)methacrylamide, N-(hydroxyphenyl)acrylamide, N-(2-cyanoethoxyphenyl)methacrylamide, N-(2-cyanoethoxyphenyl)acrylamide.

Among the above-mentioned polymers (1), copolymers of N[2-methacryloyloxy)ethyl]-2,3-dimethylmaleimide and methacrylic acid or acrylic acid, i.e. a monomer having an alkali-soluble group, as disclosed on pages 71 to 91 of Die Angewandte Makromoleculare Chemie Vol 128 (1984) are preferred. Further, multi component - copolymers prepared by effecting the copolymerization in the presence of a vinyl monomer different from the above-mentioned vinyl monomer are also preferred. Particularly, copolymers prepared by copolymerizing the monomer selected from those of the above formula (II) to (IV), the alkali-soluble vinyl monomer and the monomer having a group reactive with the photodecomposition product of the diazo resin are preferred, since the degree of crosslinking thereof can be increased.

The polymers (1) used in the present invention have a molecular weight of at least 1,000, preferably 10,000 to 500,000 and more preferably 20,000 to 300,000.

The amount of the polymer (1) is 10 to 99% by weight (referred to as %, hereinafter), preferably 50 to 99%.

The diazo resins (2) having the negative action used in the present invention are which are substantially insoluble in water and soluble in organic solvents. These diazo resins are reaction products obtained by condensing a diazo monomer with a condensing agent in a molar ratio of 1/1 to 1/0.5, preferably 1/0.8 to 1/0.6 in an ordinary manner and then reacting the thus obtained product with an anion. Examples of the diazo monomers include 4-diazodiphenylamine, 1-diazo-4-N, N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-N,N-dimethylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, p-diazodimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylamonobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazodiphenylamine and 3-isopropoxy-4-diazodiphenylamine. Examples of the condensing agents include formaldehyde, acetaldehyde, propionaldehyde, butylacetaldehyde, isobutylaldehyde and benzaldehyde, Examples of the anions include tetrachloroboric acid, hexafluorophosphoric acid, triisopropylnaphthalenesulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobezenesulfonic acid, 2-fluorocaprylnaphthalenesulfonic acid, dodecylbezenesulfonic acid, 1-naphthol-5-sulfonic acid, 2-methoxy-4-hydroxy-5-benzoylbenzenesulfonic acid and p-toluenesulfonic acid. Among these, hexafluorophosphoric acid and alkylaryl sulfonic acids such as triisopropylnaphthalenesulfonic acid and 2,5-dimethylbenzenesulfonic acid are preferred.

The amount of the diazo resin (2) is preferably 0.1 to 15%, particularly 0.3 to 5%, based on the total composition.

The composition of the present invention may contain, if necessary, a photosensitizer, preferably a triplet sensitizer having a maximum absorption capable of realizing a practically sufficient absorption at 300 nm or above. Examples of these sensitizers include thiozane, thioxanthone derivatives such as 2-chlorothioxanthone, 2-isopropylthioxanthone, dimethylthioxanthone and methylthioxanthone-1-ethyl and carboxylate and 5-nitroacenaphthene. In addition, electron-accepting compounds disclosed in the specification of Japanese Patent OPI No. 206425/1984 such as 1,2-dicyanobenze, chloraniland 2,3-dichloro-5,6-dicyanobenzoquinone are also effective. The amount of the sensitizer is preferably 1 to 20%, particularly 3 to 10%, based on the total composition.

It is preferable that the photosensitive composition of the present invention contains about 0.5 to 15%, particularly 2 to 10%, based on the composition, of a photopolymerization initiator. Examples of the initiators include α-carbonyl compounds disclosed in the specifications of U.S. Pat. Nos. 2,367,661 and 2,367,670, acyloin ethers disclosed in the specification of U.S. Pat. No. 2,448,828, aromatic acyloin compounds substituted with an α-hydrocarbon disclosed in the specification of U.S. Pat. No. 2,722,512, polynuclear quinone compounds disclosed in the specifications of U.S. Pat. Nos. 3,046,127 and 2,951,758, combinations of a triarylimidazole dimer and a p-aminophenylketone disclosed in the specification of U.S. Pat. No. 3,549,367, trihalomethyl-S-triazine compounds disclosed in the specification of U.S. Pat. No. 4,239,850, acridine and phenazine compounds disclosed in the specification of U.S. Pat. No. 3,751,259 and oxadiazole compounds disclosed in the specification of U.S. Pat. No. 4,212,970.

The photosensitive composition of the present invention preferably contains a heat polymerization inhibitor in addition to the above-mentioned components. Examples of the heat polymerization inhibitors include hydroquinone, p-methoxyphenol, di-t-buty-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzoimidazole. Further, if necessary, a dye or a pigment may be incorporated in the composition to color the photosensitive layer or, a pH indicator may also be incorporated therein as a printing-out agent.

In addition, the composition may contain a stabilizer for the diazo resin such as phosphoric acid, phosphorous acid, tartaric acid, citric acid, malic acid, dipicolinic acid, polynuclear aromatic sulfonic acids and salts thereof as well as sulfosalicylic acid, if necessary.

The above-mentioned photosensitive composition is dissolved in a suitable solvent such as 2-methoxyethanol, 2-methoxyethyl acetate, propylene glycol monomethyl ether, 3-methoxypropanol, 3-methoxypropyl acetate, methyl ethyl ketone or ethylene dichloride or a mixture of them and the solution is applied to the support. The amount of said solution is in the range of about 0.1 to 10 g/m$^2$, preferably 0.5 to 5 g/m$^2$ on dry basis.

The support to which the photosensitive composition of the present invention can be applied is a plate having a high dimensional stability. Such plates include those used heretofore as supports of printing plates and they can be used suitably in the present invention. Examples of these supports include papers, papers laminated with a plaistic (such as polyethyleine, polypropylene or polystyrene), metal plates such as aluminum (including also aluminum alloys), zinc and copper, films of plastics such as cellulose diacetate, cellulose triacetate, cellulose propionate, cellulose butyrate, cellulose acetate buryrate, cellulose nitrate, polyethylene terephthalate, polyethylene, polystyrene, polypropylene, polycarbonate and polyvinyl acetal, and papers and plastic films which are laminated with the above-mentioned metal or on which said metal are applied by vapor deposition. Among these supports, the aluminum plate is preferred, since it has an extremely high dimensional stability and excellent adhesion to the composition of the present invention and it is quite inexpensive. Further, composite sheets comprising a polyethylene terephthalate film and an aluminum sheet as disclosed in the specification of Japanese Patent Publication No. 18327/1973 are also preferred.

When a support having a metallic surface, particularly an aluminum surface, is used, it is preferred to effect a surface treatment by graining, immersion in an aqueous solution of sodium silicate, potassium fluorozirconate or a phosphate or anodic oxidation. Aluminum plates grained and then immersed in an aqueous sodium silicate solution as disclosed in the specification of U.S. Pat. No. 2,714,066 and aluminum plates subjected to the anodic oxidation and then immersed in an aqueous solution of an alkali metal silicate as disclosed in the specification of Japanese Patent Publication No. 5125/1972 are also preferred. In the anodic oxidation treatment, the aluminum plate is used as the anode in an electrolytic solution comprising an aqueous or non-aqueous solution of an inorganic acid such as phosphoric acid, chromic acid, sulfuric acid or boric acid or an organic acid such as oxalic acid or sulfamic acid or a salt thereof or a mixture of two or more of them.

Further, the electrodeposition of a silicate as disclosed in the specification of U.S. Pat. No. 3,658,662 is also effective.

In addition, a combination of surface treatments such as a process wherein an electrically grained support is subjected to the above-mentioned anodic oxidation treatment and treatment with sodium silicate as disclosed in the specifications of Japanese Patent Publication No. 27481/1971 and Japanese Patent OPI Nos. 58602/1977 and 30503/977 is effective.

Another preferred plate is that prepared by brush graining, electrolytic graining, anodic oxidation and oxidation with sodium silicate. A plate thus treated may be undercoated with a water-soluble resin such as polyvinylphosphonic acid, a polymer or copolymer having sulfonic acid group in its side chain or polyacrylic acid.

These hydrophilic property-imparting treatments are effected not only for the purpose of making the surface of the support hydrophilic but also for the purpose of preventing a harmful reaction thereof with the photosensitive composition layer provided thereon and improving the adhesion thereof with the photosensitive layer.

The photosensitive plate comprising a layer of the photosensitive composition of the present invention provided on the support is imagewise exposed to a U.V. light from a light source such as a metal halide lamp, high-pressure mercury lamp or the like, it is then treated with a developer to remove a non-exposed region of the photosensitive layer and finally, a desensitizing gum solution is applied thereto to form a lithographic plate. Preferred examples of the developers include aqueous alkali solutions containing a small amount of an organic solvent such as benzyl alcohol, 2-phenoxy-ethanol or 2-butoxyethanol; for example those disclosed in the specifications of U.S. Pat. Nos. 3,475,171 and 3,615,480. Further, developers disclosed in the specifications of Japanese Patent OPI No. 26601/1975 and Japanese Patent Publications Nos. 39464/1981 and 42860/1981 can be used as excellent developers for the photosensitive printing plates prepared by using the photosensitive composition of the present invention.

The present invention will be further illustrated by the following non-limitative examples. All "%" are by weight, unless otherwise indicated.

EXAMPLE 1

A base was prepared by a process disclosed in the specification of Japanese Patent OPI No. 28893/1981. More particularly, the surface of an aluminum plate having a thickness of 0.30 mm was grained with a nylon brush and an aqueous suspension of 400 mesh pumice and washed thoroughly with water. The plate was then immersed in 10% aqueous sodium hydroxide solution at 70° C. for 60 seconds to effect the etching, washed with running water, neutralized with 20% $HNO_3$ solution and washed with water. The surface of the plate was electrolytically roughened (160 $C/dm^2$, alternating sine wave current, $V_A=12.7$ V) in 1% aqueous nitric acid solution. The surface roughness was 0.6μ (Ra). Then, the plate was immersed in 30% aqueous $H_2SO_4$ solution at 55° C. for 2 minutes to effect treatment and then subjected to anodic oxidation treatment (current density: 1A/$dm^2$) in 20% aqueous $H_2SO_4$ solution for 2 minutes to control the thickness to 2.7 g/$m^2$. The plate was then immersed in 2.5% aqueous sodium silicate soution at 70° C. for 1 minute, washed with water and dried.

The following photosensitive composition I (liquid) was prepared:
Photosensitive composition I:
20% solution of copolymer of methyl methacrylate/N-[2-(methacryloyloxy)-ethyl]2,3-dimethyl-maleimide/methacrylic acid =15/65/20 (weight ratio) in mixture of ethyl methyl ketone/2-methoxyethanol=1/1 (weight ratio): 25 g
(Resin V disclosed in the specification of Japanese Patent Public Disclosure No. 206425/1984)

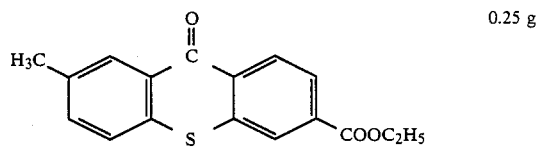
0.25 g

Dodecylbenzenesulfonate of condensate of p-diazodiphenylamine and formaldehyde: 0.10 g
F-177 (nonionic fluorine surfactant of Dai-Nippon Ink Co., Ltd.): 0.02 g
10% dispersion of a copper phthalocyanine pigment (CI Pigment Blue 15) in plasticizer: 1.0 g
10% dispersion of Aerosil R972 (silicic acid powder surface-treated with a resin; a product of Japan Aerosil Co.) in ethylene glycol monomethyl ether: 1.0 g Methyl ethyl ketone: 20 g
Methanol: 2 g
Ethylene glycol monomethyl ether acetate: 28 g The photosensitive composition I was applied to the base with a whirler so that the weight thereof after drying would be 2.0 g/m². Then, it was dried at 100° C. for 2 min.

A negative transparency was intimately contacted to the thus obtained photosensitive plate and they were exposed (20 counts) with to a light of a 2 kW metal halide lamp by using a printer of nuArc Co. (U.S.A.). After the exposure followed by the development with a developer having the following composition at 25° C. for 1 minute, a pinting plate was obtained.

Developer:
Benzyl alcohol: 4.5 g
38% aqueous solution of sodium isopropylnaphthalenesulfonate: 4.5 g
Triethanolamine: 1.5 g
Monoethanolamine: 1.5 g
Monoethanolamine: 0.1 g
Sodium sulfite: 0.3 g
Pure water: 100 g 300,000 sheets of prints could be obtained with the thus obtained printing plate by using a Heidel SOR printer.

Separately, a photosensitive plate was prepared in the same manner as above except that dodecylbenzenesulfonate of condensate of p-diazodiphenylamine and formaldehyde was omitted from the formulation of the photosensitive composition I. This plate had a gray scale sensitivity of lelss than 1/5 of that of the above product due to a poor adhesion with the base.

EXAMPLE 2

0.5% aqueous solution of a copolymer of methyl methacrylate/ethyl acrylate/sodium 2-acrylamido-2-methylpropanesulfonate (molar ratio: 50/30/20 was applied to the same base as in Example I with a roll coater and then dried at 80° C. for 1 min. The amount of the applied composition was 15 mg/m² after drying. The following photosensitive composition II was applied to the base:

Photosensitive composition II:
20% solution of copolymer of N-[2-(methacryloyloxy)ethyl)-2,3-dimethylmaleimide/methacrylic acid acid=85/15 (weight ratio) in mixture of ethyl methyl ketone/2-methoxyethanol=1/1 (weight ratio): 25 g 0.30 g PF₆ salt of condensate of p-diazo-diphenylamine and formaledehyde: 0.20 g
F-177 (nonionic fluorine surfactant of Dai-Nippon Ink Co., Ltd.): 0.02 g
Methyl ethyl ketone: 20 g
Ethylene glycol monomethyl ether: 30 g
Methanol: 10 g After drying at 100° C. for 2 min, a photosensitive plate having 2.0 g/m² of the coating was obtained. This plate was exposed and developed in the same manner as in Example 1 to obtain a printing plate.

After the printing effected with Heidel SOR printer in the same manner an in Example 1, 300,000 sheets of prints could be obtained.

As is obvious from the above description, the present invention provides a photosensitive composition usable for the preparation of photosensitive lithographic plates in which the adhesion of the layer of this composition to the base or another layer is quite excellent. With the photosensitive composition of the present invention, excellent printing plates can be obtained, since said composition contains the polymer capable of being photocrosslinked and having a sensitivity higher than that of ordinary one.

What is claimed is:

1. A photosensitive composition, which comprises, in admixture, (A) 10 to 99% by weight of a polymer having a side chain containing a maleimido group represented by the following formula (I):

wherein $R^1$ and $R^2$ each represent a hydrogen atom, a halogen atom or an alkyl group or $R^1$ and $R^2$ may form together a five-membered or six-membered ring, the polymer capable of being photo-crosslinked; and (B) 0.1 to 15% by weight of a photosensitive diazo resin.

2. A photosensitive composition as set forth in claim 1, wherein the polymer capable of being photocrosslinked has two or more maleimido groups on average per molecule in its side chain and an average molecular weight of at least 1000.

3. A photosensitive composition as set forth in claim 1, wherein the polymer capable of being photocrosslinked has an average molecular weight of 10,000 to 500,000.

4. A photosensitive composition as set forth in claim 1, wherein the diazo resin in reaction product obtained by condensing a diazo monomer with a condensing agent and then reacting the thus obtained produce with an anion.

5. A photosensitive composition as set forth in claim 4, wherein the molar ratio of the diazo monomer to the condensing agent is 1:1 to 1:0.5.

6. A photosensitive composition as set forth in claim 1, wherein the photosensitive composition comprises 1 to 20% by weight of a sensitizer.

7. A photosensitive composition as set forth in claim 1, wherein the photosensitive composition comprises 0.5 to 15% by weight of a photopolymerization initiator.

8. A photosensitive composition as set forth in claim 1 wherein the halogen atom is selected from the group consisting of chlorine, bromine and iodine, and wherein the alkyl group has 1 to 4 carbon atoms.

9. A photosensitive composition as set forth in claim 8 wherein the alkyl group is a methyl group.

10. A photosensitive printing plate which comprises a support and a photosensitive composition comprising, in admixture, (A) 10 to 99% by weight of a polymer having a side chain containing a maleimido group represented by the following formula (I):

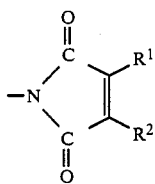

(I)

wherein $R^1$ and $R^2$ each represent a hydrogen atom, a halogen atom or an alkyl group or $R^1$ and $R^2$ may form together a five-membered or six-membered ring, the polymer capable of being photo-crosslinked; and (B) 0.1 to 15% by weight of a photosensitive diazo resin in which the composition is applied to the support.

11. A photosensitive printing plate as set forth in claim 10, wherein amount of the photosensitive composition is about 0.1 to about 10 g/m² on dry basis.

12. A photosensitive printing plate as set forth in claim 10, wherein the polymer capable of being photo-crosslinked has two or more maleimido groups on average per molecule in its side chain and an average molecular weight of at least 1000.

13. A photosensitive printing plate as set forth in claim 10, wherein the polymer capable of being photo-crosslinked has an average molecular weight of 10,000 to 500,000.

14. A photosensitive printing plate as set forth in claim 10, wherein the diazo resin is reaction product obtained by condensing a diazo monomer with a condensing agent and then reacting the thus obtained product with an anion.

15. A photosensitive printing plate as set forth in claim 14, wherein the molar ratio of the diazo monomer to the condensing agent is 1:1 to 1:0.5.

16. A photosensitive printing plate as set forth in claim 10 wherein the halogen atom is selected from the group consisting of chlorine, bromine and iodine, and wherein the alkyl group has 1 to 4 carbon atoms.

17. A photosensitive printing plate as set forth in claim 16 wherein the alkyl group is a methyl group.

* * * * *

UNITED STATES PATENT AND TRADEMARK OFFICE
CERTIFICATE OF CORRECTION

PATENT NO. : 4,845,009

DATED : July 4, 1989

INVENTOR(S) : Nobuyuki Kita; Masanori Imai

It is certified that error appears in the above-identified patent and that said Letters Patent is hereby corrected as shown below: On the title page:

[54] PHOTOSENSITIVE COMPOSITION COMPRISING A POLYMER WITH MALEIMIDE GROUP IN SIDE CHAIN AND A DIAZO RESIN

Signed and Sealed this

Fifth Day of June, 1990

*Attest:*

HARRY F. MANBECK, JR.

*Attesting Officer*     *Commissioner of Patents and Trademarks*